United States Patent
Martorell Pena et al.

(10) Patent No.: US 9,748,423 B2
(45) Date of Patent: Aug. 29, 2017

(54) PHOTOVOLTAIC DEVICE WITH FIBER ARRAY FOR SUN TRACKING

(71) Applicants: Jordi Martorell Pena, Barcelona (ES); Pablo Romero Gómez, Barcelona (ES); Marina Mariano Juste, Barcelona (ES); Francisco J. Rodriguez Martinez, Barcelona (ES)

(72) Inventors: Jordi Martorell Pena, Barcelona (ES); Pablo Romero Gómez, Barcelona (ES); Marina Mariano Juste, Barcelona (ES); Francisco J. Rodriguez Martinez, Barcelona (ES)

(73) Assignees: Fundacio Institut De Ciencies Fotoniques, Barcelona (ES); Universitat Politecnica De Catalunya, Barcelona (ES)

( * ) Notice: Subject to any disclaimer, the term of this patent is extended or adjusted under 35 U.S.C. 154(b) by 0 days.

(21) Appl. No.: 14/157,138

(22) Filed: Jan. 16, 2014

(65) Prior Publication Data

US 2015/0200320 A1 Jul. 16, 2015

(51) Int. Cl.
*H01L 31/0392* (2006.01)
*H01L 31/0224* (2006.01)
(Continued)

(52) U.S. Cl.
CPC ........ *H01L 31/0392* (2013.01); *H01L 27/304* (2013.01); *H01L 31/022466* (2013.01); *H01L 31/0326* (2013.01); *H01L 31/03923* (2013.01); *H01L 31/03925* (2013.01); *H01L 31/0543* (2014.12); *H01L 31/0547* (2014.12);
(Continued)

(58) Field of Classification Search
CPC .............. H01L 31/0344; H01L 27/304; H01L 31/02366; H01L 31/022433; H01L 51/445; H01L 31/02167; H01L 31/02168; H01L 31/02322; H01L 31/02325; H01L 31/02327; H01L 31/054; H01L 31/0543; H01L 31/0547; H01L 31/055; H01L 31/0549; H01L 31/056; G02B 6/08;
(Continued)

(56) References Cited

U.S. PATENT DOCUMENTS 4,053,327 A * 10/1977 Meulenberg, Jr. .. H01L 31/0547
 136/256
4,140,142 A 2/1979 Dormidontov et al. .. 136/89 PC
(Continued)

FOREIGN PATENT DOCUMENTS

DE 20 2009 002331 4/2009
WO WO2011160017 A2 * 12/2011

OTHER PUBLICATIONS

Y-C. Chen, et al., "Low-bandgap conjugated polymer for high efficient photovoltaic applications", Chemical Communications 46, p. 6503-6506 (2010).*
(Continued)

*Primary Examiner* — Eric R Smith
(74) *Attorney, Agent, or Firm* — Ostrolenk Faber LLP

(57) ABSTRACT

Disclosed is a photovoltaic device that includes a solar cell on a light transmissive substrate in the form of an array of equal diameter optical fibers laid adjacent to each other in the transversal direction of the fibers. With such an arrangement, light harvesting at high angles is improved by 30%.

17 Claims, 5 Drawing Sheets

(51) Int. Cl.
  *H01L 31/054* (2014.01)
  *H01L 31/032* (2006.01)
  *H01L 27/30* (2006.01)
  *H01L 51/44* (2006.01)

(52) U.S. Cl.
  CPC ............ *H01L 51/447* (2013.01); *Y02E 10/52* (2013.01); *Y02E 10/541* (2013.01); *Y02E 10/549* (2013.01)

(58) Field of Classification Search
  CPC ..... G02B 6/0011; G02B 6/0025; H02S 40/20; H02S 40/22
  USPC ................................................ 385/114, 120
  See application file for complete search history.

(56) References Cited

U.S. PATENT DOCUMENTS

| | | | | |
|---|---|---|---|---|
| 4,271,104 | A * | 6/1981 | Anderson | G02B 6/448 264/1.24 |
| 4,400,409 | A * | 8/1983 | Izu | C23C 16/517 136/245 |
| 4,419,530 | A * | 12/1983 | Nath | H01L 31/022425 136/244 |
| 4,711,972 | A * | 12/1987 | O'Neill | F24J 2/085 136/246 |
| 4,868,664 | A * | 9/1989 | Yaniv | H01L 27/14623 257/E27.141 |
| 5,575,860 | A | 11/1996 | Cherney | 136/245 |
| 6,087,579 | A * | 7/2000 | Muskatevc | H01L 31/0547 136/246 |
| 6,300,612 | B1 * | 10/2001 | Yu | B82Y 10/00 250/208.1 |
| 6,420,644 | B1 * | 7/2002 | Fukui | H01L 31/0236 136/244 |
| 2003/0031435 | A1 * | 2/2003 | Yeh | G02B 6/08 385/120 |
| 2004/0109666 | A1 * | 6/2004 | Kim, II | 385/147 |
| 2005/0011549 | A1 * | 1/2005 | Miyoshi | H01G 9/20 136/243 |
| 2005/0098202 | A1 * | 5/2005 | Maltby, Jr. | H01L 31/0296 136/256 |
| 2006/0013549 | A1 * | 1/2006 | Shtein et al. | 385/128 |
| 2006/0102891 | A1 * | 5/2006 | Brabec | H01L 31/0236 257/40 |
| 2007/0169805 | A1 * | 7/2007 | Sasaki | H01L 31/022466 136/256 |
| 2009/0272422 | A1 * | 11/2009 | Li | H01L 31/022425 136/244 |
| 2009/0314333 | A1 * | 12/2009 | Shepard | G02B 6/04 136/248 |
| 2010/0307580 | A1 * | 12/2010 | Carroll et al. | 136/256 |
| 2011/0008926 | A1 * | 1/2011 | Irvin | H01L 51/0096 438/82 |
| 2011/0062410 | A1 * | 3/2011 | Ivanov | H01L 51/4233 257/9 |
| 2011/0100431 | A1 * | 5/2011 | Horng et al. | 136/249 |
| 2011/0232211 | A1 * | 9/2011 | Farahi | B32B 5/022 52/173.3 |
| 2011/0247689 | A1 * | 10/2011 | Chabrecek et al. | 136/256 |
| 2011/0297229 | A1 | 12/2011 | Gu et al. | 136/259 |
| 2012/0134618 | A1 * | 5/2012 | Carroll | B82Y 10/00 385/2 |
| 2012/0138780 | A1 | 6/2012 | Heidler et al. | 250/227.21 |
| 2012/0234373 | A1 | 9/2012 | Colby | 136/246 |

OTHER PUBLICATIONS

J. Hou, et al., "Bandgap and molecular energy level control of conjugated polymer photovoltaic materials based on benzo[1,2-b:4,5-b']dithiophene", Macromolecules 41, p. 6012-6018 (2008).*
Definition of "array" [retrieved from http://www.thefreedictionary.com/array on Mar. 28, 2016].*
Wikipedia contributors. "PEDOT-TMA." Wikipedia, The Free Encyclopedia. Wikipedia, The Free Encyclopedia, May 22, 2015. Web. Jul. 13, 2015 (Exhibit 1).
"ICBA." ICBA | 1-Material—Organic Nano Electronic. Web. Jun. 14, 2015 (Exhibit 2).
Wikipedia contributors. "Transparent conducting film." Wikipedia, The Free Encyclopedia. Wikipedia, The Free Encyclopedia, Jul. 3, 2015. Web. Jul. 13, 2015 (Exhibit 3).
Wikipedia contributors. "Copper indium gallium selenide." Wikipedia, The Free Encyclopedia. Wikipedia, The Free Encyclopedia, Mar. 31, 2015. Web. Jul. 13, 2015 (Exhibit 4).
Wikipedia contributors. "Dye-sensitized solar cell." Wikipedia, The Free Encyclopedia. Wikipedia, The Free Encyclopedia, Jul. 8, 2015. Web. Jul. 13, 2015 (Exhibit 5).
European Search Report dated Jun. 9, 2015 issued in European Application No. 15151297.7-1504.
Verreet et al., "The characterization of chloroboron (III) subnaphthalocyanine thin films and their application as a donor material for organic solar cells.", *J. Mater. Chem.*, 19:5295-5297 (2009).
Lin et al., "A Low-Energy-Gap Organic Dye for High-Performance Small-Molecule Organic Solar Cells.", *Journal of the American Chemical Society*, 133:15822-15825 (2011).
Wojdyla et al., "Absorption and photoreflectance spectroscopy of zinc phthalocyanine (ZnPc) thin films grown by thermal evaporation.", *Materials Letters*, 60:3441-3446(2006).
Kim et al., "Effect of Nanoscale SubPc Interfacial Layer on the Performance of Inverted Polymer Solar Cells Based on P3HT/$PC_{71}BM$.", *ACS Applied Materials & Interfaces*, 3:4279-4285 (2011).

* cited by examiner

PHOTOVOLTAIC DEVICE WITH FIBER ARRAY FOR SUN TRACKING

FIELD OF THE INVENTION

The present invention relates to fixed photovoltaic cells, cells that are not provided with mechanical means for tracking the sun movement. More in particular, the invention is a photovoltaic cell provided with means that greatly enhance performance with sun inclination that is, a device configuration that can mimic sun tracking. The invention is also directed to a method for manufacturing such a cell.

DESCRIPTION OF THE RELATED ART

In a fixed photovoltaic (PV) installation the lack of sun tracking means leads to a rather inefficient energy harvesting. Indeed, a double axis system to track the sun for a PV installation located close to the parallel 40 deg would allow for a 38% increase in the energy harvesting capacity. Inefficient energy harvesting is also inherent to vertical PV installations. For instance, in the course of a year, a vertical PV installation on the façade of a building located also at parallel 40 deg would miss close to 33% of the luminous energy available from the sun. However, for several practical reasons neither mechanical sun tracking systems nor non-vertical building integrated photovoltaic installations may be considered as optimal solutions. Recently, a configuration providing multiple reflections for the light rays has been proposed (Geometric light trapping with a V-trap for efficient organic solar cells, Soo Jin Kim at. Al, Optical Society of America 2013). This V-shaped configuration of the panel allegedly increases performance up to a 35%. This configuration, however, still does not significantly improve light harvesting away from normal incidence, and results in a structure which may be expensive and complex to produce at industrial level.

SUMMARY OF THE INVENTION

The invention provides a photovoltaic device comprising a solar cell, on a light transmissive substrate in the form of an array of equal diameter optical fibers laid adjacent to each other in the transversal direction of the fibers and at the face intended to face the sun. With such an arrangement, light harvesting at high angles is improved by 30%. In a particular embodiment, the cell comprises an active layer with a thickness between 10 nm and 2 μm enclosed between a first light transmissive electrical contact layer at the side intended to face the sun and a second electrical contact layer, the array being on top of the cell. Other embodiments will be apparent from the depending claims.

BRIEF DESCRIPTION OF THE DRAWINGS

To complete the description and in order to provide for a better understanding of the invention, a set of drawings is provided. Said drawings illustrate a preferred embodiment of the invention, which should not be interpreted as restricting the scope of the invention, but just as an example of how the invention can be embodied.

DETAILED DESCRIPTION OF THE INVENTION

In the present invention, a whispering gallery (WG) coupling configuration is used based on implementing a thin film photovoltaic cell on the back side of an array of parallel fibers (for back side it is understood the side which is going to be further away from the incoming light rays). In such an array, light can be coupled into low quality factor WG resonant modes of the fibers. Such coupling becomes more effective as the angle for the incident light relative to the normal of the fiber array increases up to 55 deg. In any case, as we will show below, light absorption at the active layer of the cell is at all angles larger for the fiber array configuration when compared to the standard planar configuration. In addition, the specific angular dependence of the light absorption in the configuration of the invention provides an optimal solution to mimic sun-tracking systems or to enhance light harvesting for vertically positioned panels.

Figure 1:
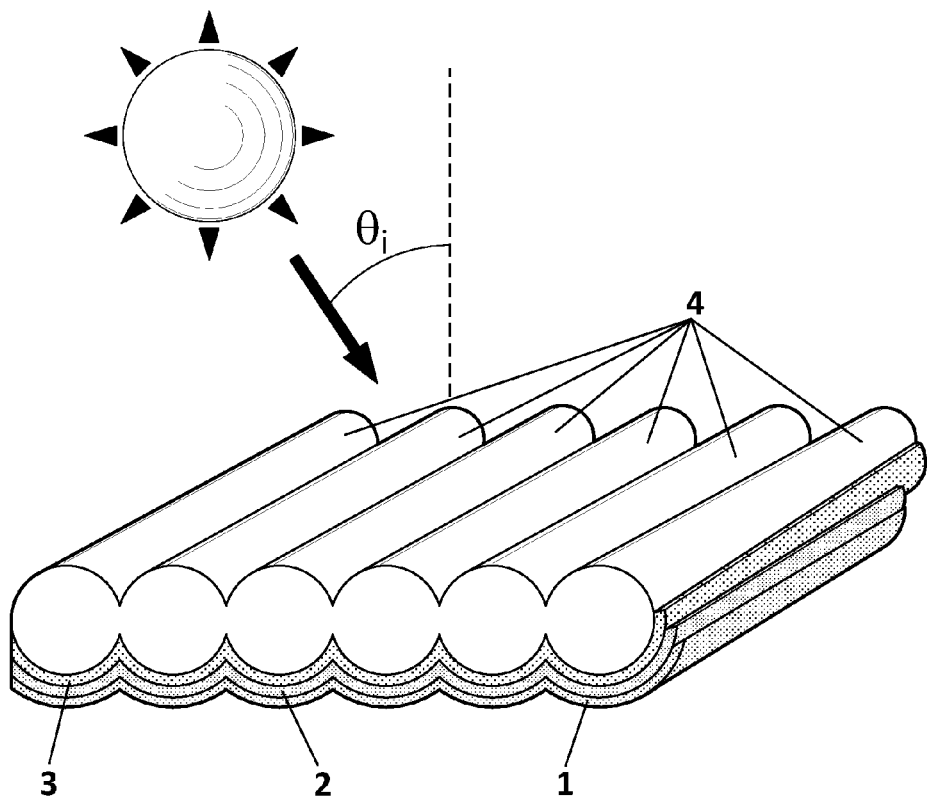
FIG. 1 shows a general configuration of the invention.
Figure 2:
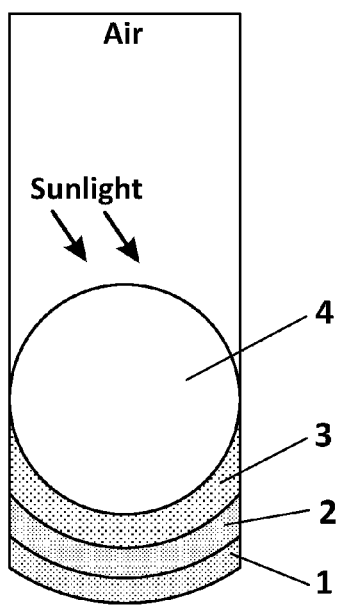
FIG. 2 shows a detail of the previous configuration.

A schematic view of the proposed photovoltaic device can be seen in FIG. 1. The device consists of a number of fibers stuck together forming an array of parallel fibers 4 that serve as the support for a thin film solar cell device. The different layers of the cell architecture are deposited on the back side of the array relative to the incoming sunlight incident on the front side of the array with an angle $\theta_i$. A detailed cross section of a single cell fiber from the array is shown enlarged in FIG. 2. The fibers can be of any transparent or semi-transparent material such as glass, crystal, transparent semiconductor or plastic. Examples of these materials are silica (SiO2), sapphire, borosilicate (BK7) and PET.

To ensure good electrical contact of the different photovoltaic layers deposited on the fibers, ideally, adjacent fibers must be in good physical contact in the transversal direction. A fabrication method for the fiber array can be the following: A number of glass fibers are laid against each other and clamped on both ends of the longitudinal direction of the fibers. Such an array of fibers is heated, using a flame, heat radiator or similar, up to the fusion temperature of the fiber material so that adjacent fibers fuse with each other. Simultaneously, while the fiber array is heated, such fiber array is pulled from the clamps to reduce the diameter of the fibers to the optimal diameter 0.5-500 μm. The total number of the fibers to be used is determined by initial fiber diameter, the desired size for the solar module and the total pulling applied. For instance, under the assumption that the fibers used are 80 μm fibers, pulling can be applied to reduce the diameter of the fibers by 40 times to obtain 2 μm fibers. As an example, in the event that the desired solar module size would be 1 cm×1 cm one should use a total of 500 fibers.

In one embodiment, the back side of this substrate is coated with three layers, comprising: a transparent electrode 3 of a transparent conductive oxide layer from the group of ITO, ZnO, Al:ZnO, SnO2, FTO, or conductive polymers such as PEDOT, PEDOT:PSS, PEDOT-TMA or a carbon nanotube, or a graphene layer of a thickness between 0.3 nm and 350 nm; an active layer 2 made of an hetero-junction comprising an electron donor and an electron acceptor materials, and a metallic contact layer 1 comprising Ag, Al, Au, Cu, a combination of them, or any other good electrical conductor metal.

In certain embodiments, the interface between the first transparent electrode 3 and the active layer 2 may be filled with a thin layer of a charge transporting material (ZnO, PFN, or TiO2, MoO3, PEDOT:PSS, WO3, NiO) with a thickness between 1 nm and 150 nm, while the space separating the active layer 2 from the metallic contact 1 may be filled with a thin layer of the opposite charge transporting material (ZnO, PFN, or TiO2, MoO3, PEDOT:PSS, WO3, NiO), with a thickness between 1 nm and 150 nm.

In one embodiment the active layer comprises an organic active material forming a blend that contains a mixture of two components: a semiconductor conjugated polymer and a fullerene compound. The first component is a conjugated polymer with alternating electron-donor and electron-acceptor monomers. The donor is always a derivative of benzo [1,2-b:4,5-b']dithiophene, whereas as acceptor many different types of compounds can be used, for example, though not exclusively, thiophene, benzothiadiazole or diketopyrrolopyrrole derivatives. Alternatively, the first component is a α-PTPTBT polymer, where the electron donating unit is a thiophene-phenylene-thiophene (TPT) and the acceptor unit is 2,1,3-benzothiadiazole (BT). Alternatively, the first component is a polythiophene polymer (P3HT). The second component of the blend is $C_{60}$ or a soluble derivative of the fullerene family of compounds. The thickness of the whole active material layer is between 40 nm and 500 nm.

In another embodiment, the active layer comprises a hetero-junction or bulk hetero-junction formed from small donor molecules (SubPc, DTDCTB, SubNc, ZnPc) and small acceptor molecules (C60, C70) that can be deposited by evaporation under high vacuum.

In another embodiment, the active layer comprises a thin film hetero-junction of n and p inorganic semiconductors such as a-Si, CIGS, CdTe, Kesterites, DSSC, perovskites.

Alternatively, the active layer may comprise a stack of two or more of active materials forming a tandem cell configuration. The separation between active layers in the stack may comprise an interlayer to recombine holes and electrons when the active layers are in a series configuration or an intermediate electrical contact when the active layers are in a parallel configuration or a transparent dielectric when the cells are externally connected.

Figure 3A:
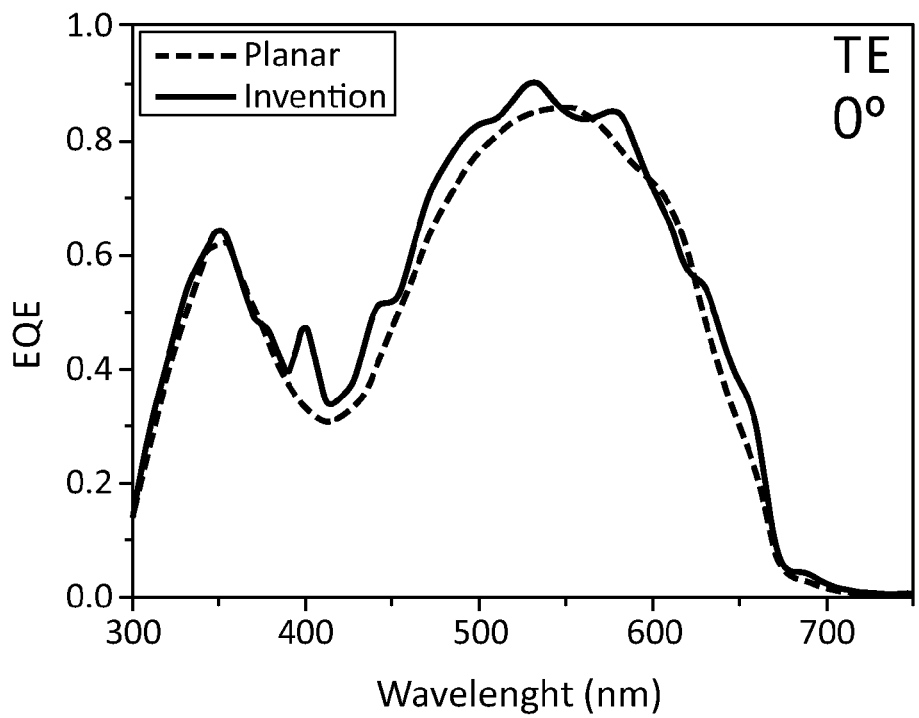
FIGS. 3a and 3b show a comparison of the external quantum efficiencies of a cell according to the invention and a planar one when the light's incident angle is set to 0 deg.
Figure 3B:
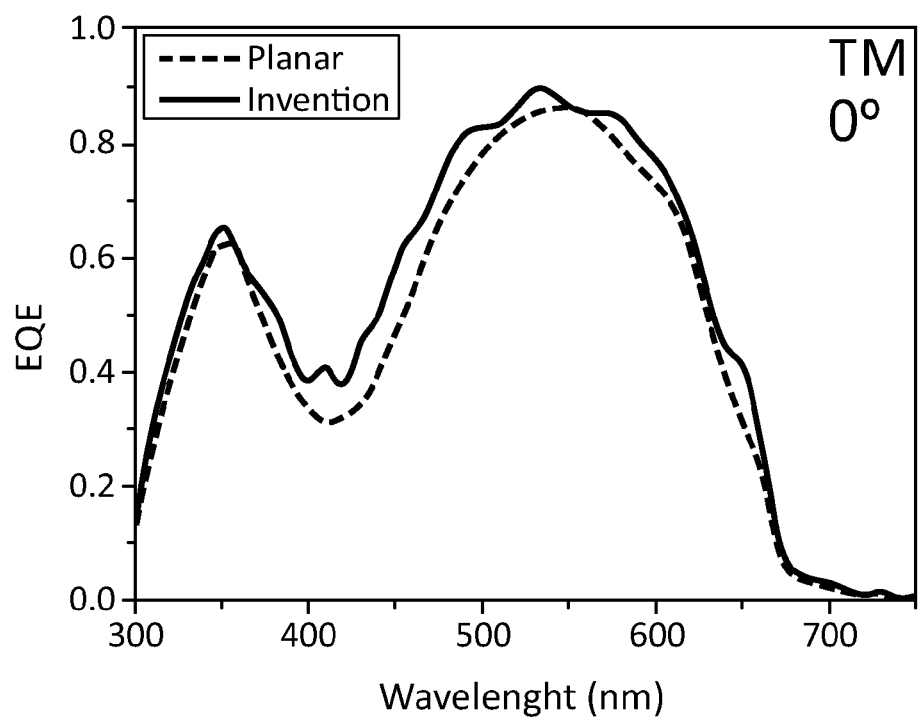
Figure 3C:
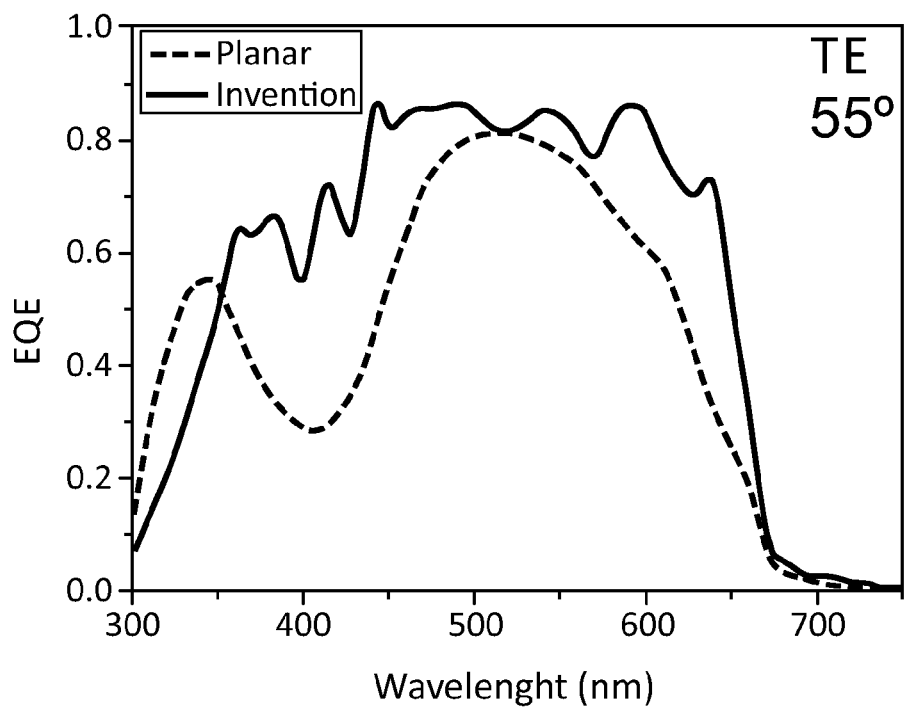
FIGS. 3c and 3d show a comparison of the external quantum efficiencies of a cell according to the invention and a planar one when the light's incident angle is set to 55 deg.
Figure 3D:
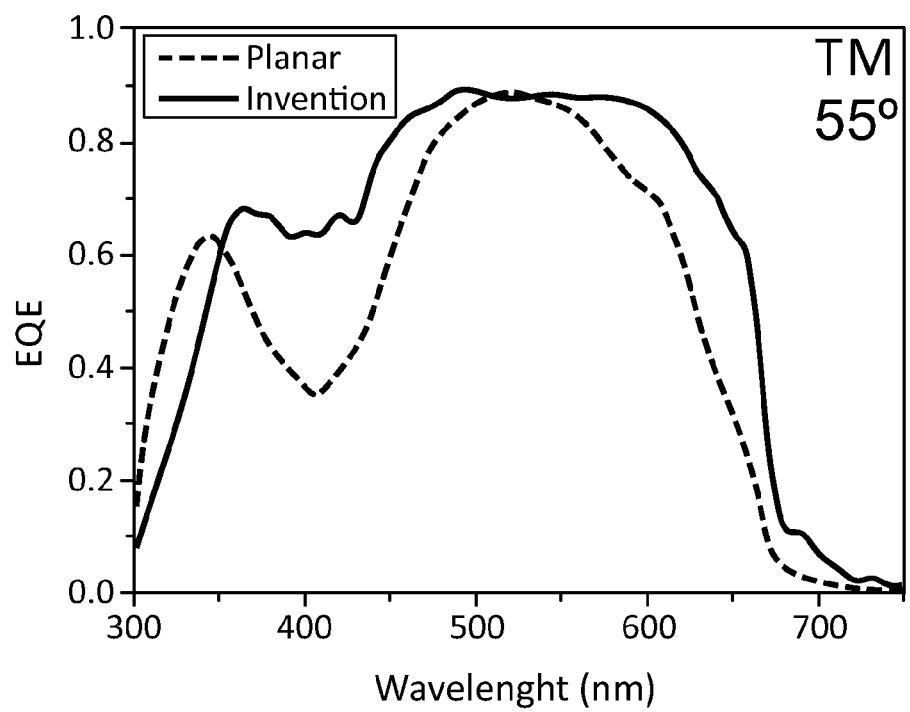
Figure 4A:
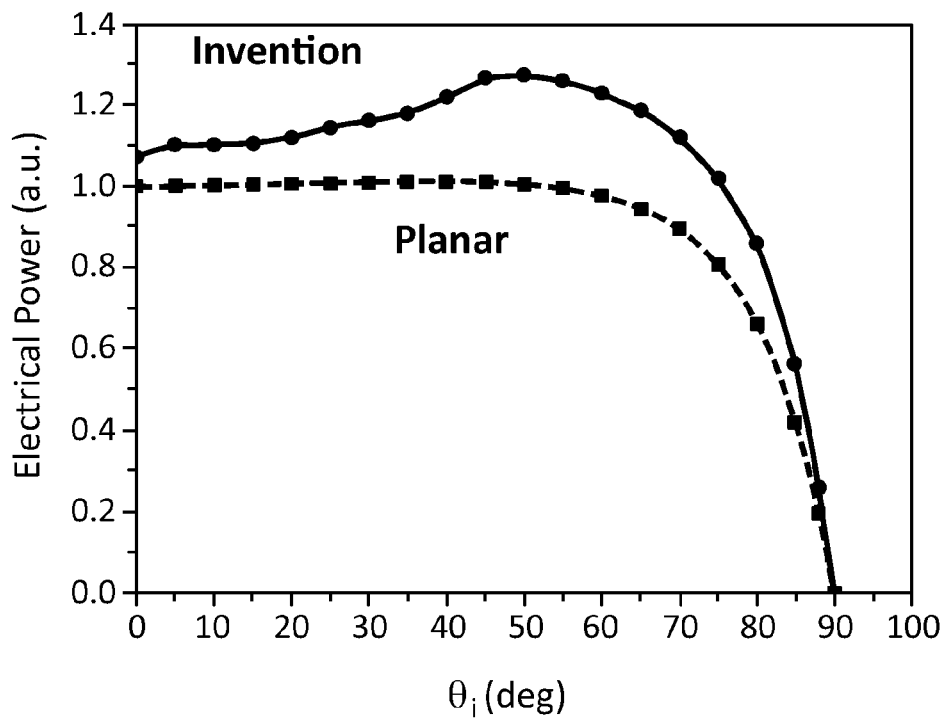
FIGS. 4a and 4b show normalized current and electrical power for the invention and a planar cell for different light incident angles.
Figure 4B:
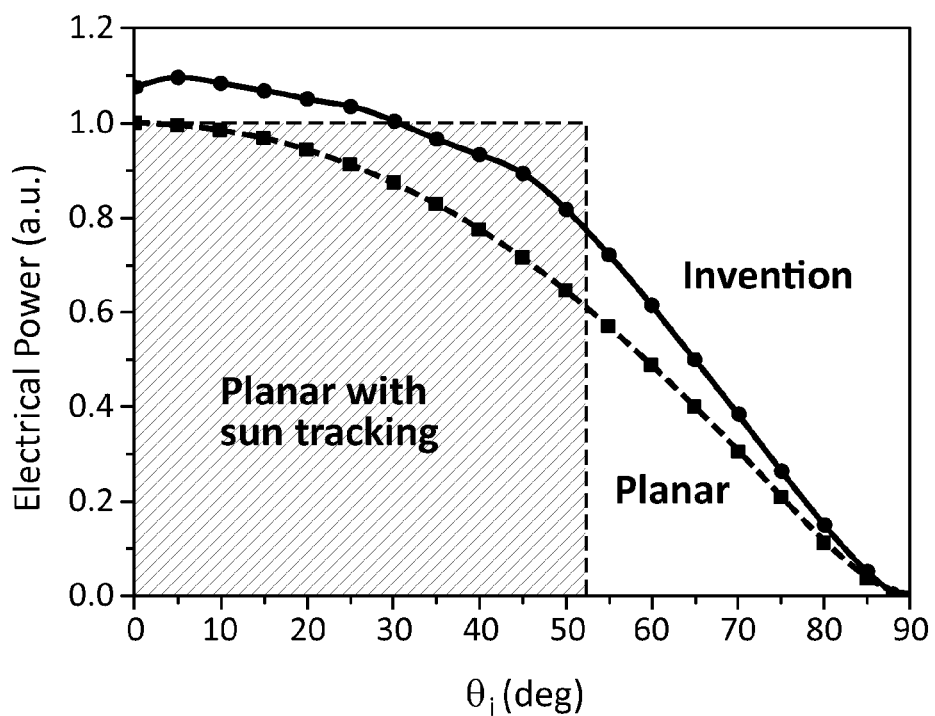

In a particular embodiment, the diameter of the fused silica fiber was set to 1.5 µm, while the thicknesses of the first transparent contact layer (ITO in this case), the active layer of P3HT:ICBA and the electrical contact layer of Al were set each of them to 100 nm, corresponding to the approximate parameters for an optimized performance for an equivalent planar cell. In this embodiment, the thickness of the charge blocking layers was considered negligible. The refractive indices of all materials were taken from experimental measurements except for the fused silica which was taken from the literature. In-plane (TM) and out-of-plane (TE) polarizations were calculated separately with a power excitation corresponding to one sun. For comparison, an organic planar cell was also studied and the same conditions were applied. In the latter case, light was incident from a fused silica glass substrate and the power of the incident light was corrected by the corresponding Fresnel coefficient for the air-glass refraction. The convolution of the P3HT:ICBA extinction coefficient with the sun photon flux leaves a wavelength window for PV operation ranging from 300 nm to 750 nm. At each wavelength, the total power dissipation over the active layer area is integrated to extract the photon absorption in this layer or, equivalently, the External Quantum Efficiency (EQE). The EQE should be understood as the percentage of collected charges relative to the number of incident photons at a given wavelength. The EQEs at normal incidence (0 deg) for the invention and planar cells at, both, TE and TM polarizations are shown in FIGS. 3a and 3b, respectively. At 0 deg the performance of the invention is slightly better than that of a planar device, but when the light is incident at 55 deg the improvement is remarkable. The EQE for the invention, shown for the TE and TM polarizations in FIGS. 3c and 3d, respectively, is largely improved at almost the entire wavelength range. To estimate the short circuit current density (Jsc) in comparison to the efficiency of the standard planar organic PV cell, the Jsc obtained as a function of the angle of incidence is given (FIG. 4a). This Jsc was calculated integrating the EQE multiplied by the solar photon flux and the electron charge q over all wavelengths λ, as in the equation $$J_{SC} = \int EQE(\lambda) I(\lambda) \lambda / hc\, q\, d\lambda$$

where I(λ) indicates the standard AM1.5G spectral irradiance of the Sun. At normal incidence, the Jsc for the invention is 6% higher than the planar cell. When the angle of incidence increases the planar cell's Jsc stays almost constant up to 40 deg, whereas for the invention it increases with angle as the light gets coupled more effectively into the WG mode. The Jsc exhibits a maximum at 55 deg being 30% larger than the planar. At higher angles, as expected, the Jsc decays rapidly, but for the invention remains always larger. As the angle increases, the electrical power generated for both cells would decrease by a cos(incident angle) factor accounting for the projected area to a surface normal to the direction of the incident light. As shown in FIG. 4b, this reduction in electrical power can be partially compensated by the invention due to a photocurrent generation that is maximized at 55 deg rather than at normal incidence. For a solar cell placed perpendicular to the sun at midday, energy collected from sunrise to sunset is proportional to two times the area underneath the curves shown in FIG. 4b. This area is 17% times larger for the invention than for the planar case. As shown in FIG. 4b too, the energy collected by the invention from 0 to 52 deg will be equivalent to the energy collected by a planar cell maintained, at all times, perpendicular to the sun in that angular range.

The number of absorbed photons per unit area by the invention increases as the sun inclination relative to the cell normal increases from 0 to 55 deg. Note that when light harvesting takes place, for instance, close to parallel 40, the optimal orientation for any kind of fix PV installation would approximately be 35 deg above the horizontal line. This corresponds to the sun being at 55 deg above the horizon. At such large angle, the EQE for the invention would reach its maximum possible value for a wide wavelength range. The invention ensures an optimal light harvesting for a vertical installation in the event that the fibers of the array would be oriented in the parallel direction. On the other hand, in the event that the array would be oriented in the meridian direction, the angular increase in power conversion efficiency would provide, over the course of one day, an energy harvesting capacity similar to the one obtained from a one-axis tracking system.

Figure 5:
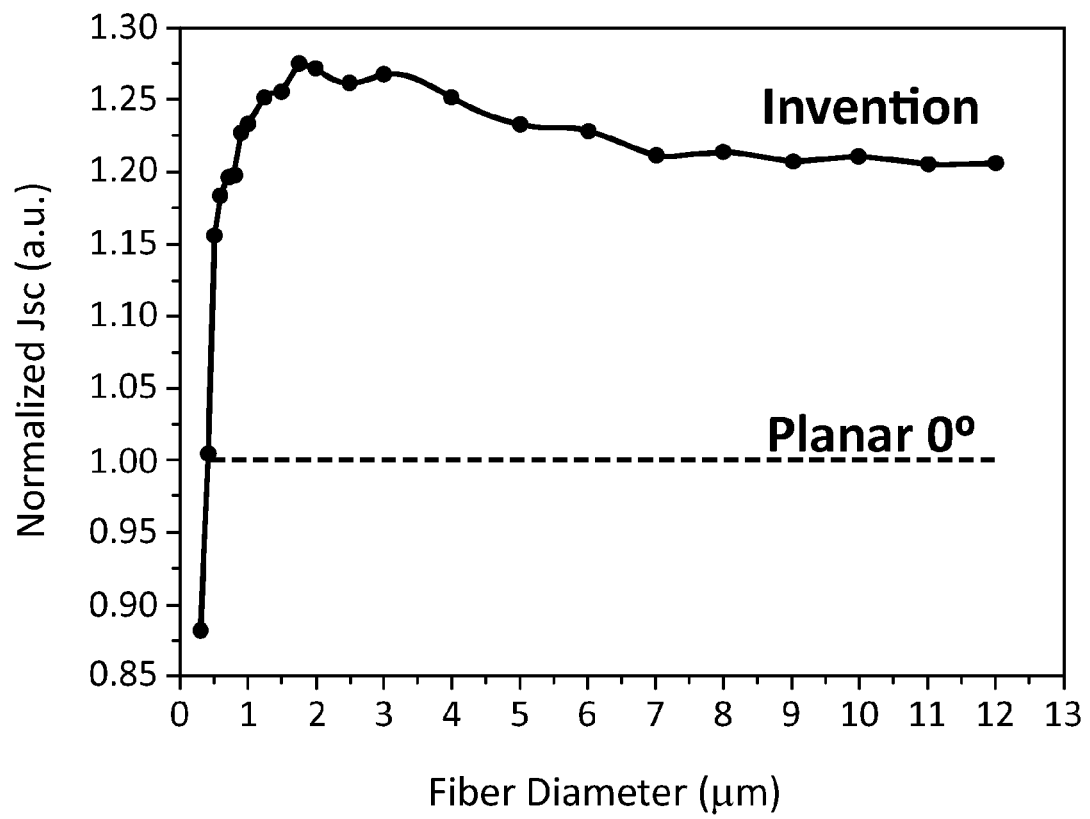
FIG. 5 shows the normalized current at 55 deg of incidence for different fiber diameters

At an incidence of 55 deg we studied the Jsc dependence with the fiber diameter (FIG. 5), keeping the other geometrical parameters fixed. At diameters below 400 nm, when light confinement at the perimeter of the fiber close to the back metal contact is ineffective, the Jsc for the invention is not better than for the planar configuration. As seen in FIG. 5, this situation is reversed as the diameter is increased, and the Jsc reaches a maximum at 1.75 µm. Finally, we considered the performance for the invention as the separation between adjacent fibers was varied. The Jsc varies little as the fiber separation is increased up to 300 nm, while it shows a mildly pronounced drop as adjacent fibers get closer to progressively overlap and eventually causing the final invention's configuration to resemble a planar device. Such drop in Jsc occurs mostly in between −100 and −200 nm. The ideal separation between fibers is zero nm, in other words adjacent fibers should be just in contact.

In this text, the term "comprises" and its derivations (such as "comprising", etc.) should not be understood in an excluding sense, that is, these terms should not be interpreted as excluding the possibility that what is described and defined may include further elements, steps, etc.

On the other hand, the invention is obviously not limited to the specific embodiment(s) described herein, but also encompasses any variations that may be considered by any person skilled in the art (for example, as regards the choice of materials, dimensions, components, configuration, etc.), within the general scope of the invention as defined in the claims.

The invention claimed is:

1. A photovoltaic device comprising:
a unitary body comprised of an array of equal diameter, parallel, cylindrical and transparent optical fibers laid adjacent to each other and fused to one another in the transversal direction of the fibers, each of the fibers being solid throughout its thickness, and a solar cell comprising an active layer residing between a first light transmissive electrical contact layer at the side that receives the solar rays and a second electrical contact layer,
wherein the array is on top of the solar cell at the side that receives the solar rays,
wherein the solar cell is parallel to the optical fibers in the array, and
wherein at least the first light transmissive electrical contact layer conforms to the cylindrical exterior surfaces of the transparent optical fibers in the array.

2. A photovoltaic device according to claim 1, wherein the active layer has a thickness between 10 nm and 2 mm.

3. A photovoltaic device according to claim 1, wherein the diameter of the fibers is between 0.5 and 500 µm.

4. A photovoltaic device according to claim 2, wherein the active layer is a blend that contains a mixture of a semiconductor conjugated polymer and a fullerene compound.

5. A photovoltaic device according to claim 2, wherein the active layer comprises a hetero junction or bulk hetero junction formed from small donor molecules and small acceptor molecules.

6. A photovoltaic device according to claim 5, wherein the small donor molecules may be selected from a group consisting of subphthalocyanine (SubPc), DTDCTB, subnaphalocyanine (SubNc), and zincphthalocyanine (ZnPc), and small acceptor molecules may be C60 or C70.

7. A photovoltaic device according to claim 2, wherein the active layer comprises a stack of two or more active materials forming a tandem cell configuration, wherein separation between active layers in the stack comprises an interlayer to recombine holes and electrons when the active layers are in a series configuration or an intermediate electrical contact when the active layers are in a parallel configuration.

8. A photovoltaic device according to claim 2, wherein the active layer comprises a thin film hetero junction of n and p inorganic semiconductors selected from a group consisting of a-Si, copper indium gallium (di) selenide (CIGS), CdTe, Kesterites, and perovskites.

9. A photovoltaic device according to claim 2, further comprising a first layer of a charge transporting material between the first light transmissive electrical contact layer and the active layer, and a second layer of charge transporting material between the active layer and the second electrical contact layer, the first and second charge transporting materials having opposite polarities.

10. A photovoltaic device according to claim 4, wherein the conjugated polymer includes alternating electron-donor and electron-acceptor monomers.

11. A photovoltaic device according to claim 10, wherein the donor is always a derivative of benzo[1,2-b:4,5-b]dithiophene.

12. A photovoltaic device according to claim 4, wherein the conjugated polymer is ∞-PTPTBT polymer, and wherein the electron donating unit is a thiophene-phenylene-thiophene (TPT) and the acceptor unit is 2,1,3-benzothiadiazole (BT).

13. A photovoltaic device according to claim 4, wherein the conjugated polymer is polythiophene polymer (P3HT).

14. A photovoltaic device according to claim 4, wherein the fullerene compound is C60 or a soluble derivative of the fullerene family of compounds.

15. A photovoltaic device according to claim 1, wherein the optical fibers comprise silica ($SiO_2$), sapphire, borosilicate (BK7) or polyethylene terephthalate (PET).

16. A photovoltaic device according to claim 1, wherein the solar cell includes a transparent electrode on the fibers, an active layer on the transparent electrode, and a metallic contact on the active layer.

17. A photovoltaic device according to claim 1, wherein the first light transmissive electrical contact layer is in direct contact with the array.

* * * * *